US 6,665,917 B2

(12) United States Patent
Knowles et al.

(10) Patent No.: US 6,665,917 B2
(45) Date of Patent: Dec. 23, 2003

(54) METHOD OF FABRICATING A PLANAR PRE-STRESSED BIMORPH ACTUATOR

(75) Inventors: Gareth J. Knowles, Williamsport, PA (US); Bruce Bower, Williamsport, PA (US)

(73) Assignee: QorTek, Inc., Williamsport, PA (US)

( * ) Notice: Subject to any disclaimer, the term of this patent is extended or adjusted under 35 U.S.C. 154(b) by 0 days.

(21) Appl. No.: 10/078,887

(22) Filed: Feb. 19, 2002

(65) Prior Publication Data

US 2002/0079785 A1 Jun. 27, 2002

Related U.S. Application Data

(62) Division of application No. 09/819,508, filed on Feb. 28, 2001, now Pat. No. 6,465,931.
(60) Provisional application No. 60/192,887, filed on Mar. 29, 2000.

(51) Int. Cl.[7] .............................................. H04R 17/00
(52) U.S. Cl. ......................... 29/25.35; 29/592; 29/825; 29/832
(58) Field of Search .................... 310/316.01, 317, 310/319; 307/11, 15–21; 323/268, 277, 259; 363/17, 98, 132; 29/25.35, 592, 825, 832

(56) References Cited

U.S. PATENT DOCUMENTS

| 4,099,876 | A | | 7/1978 | Dorsman |
| 4,978,881 | A | * | 12/1990 | Wakita et al. ............... 310/328 |
| 5,271,133 | A | * | 12/1993 | Dam et al. .................. 29/25.35 |
| 5,473,214 | A | * | 12/1995 | Hildebrand .................. 310/321 |
| 5,493,165 | A | * | 2/1996 | Smith et al. ................. 310/328 |
| 5,744,988 | A | | 4/1998 | Condon et al. |
| 5,828,160 | A | * | 10/1998 | Sugishita ..................... 310/366 |
| 5,962,951 | A | | 10/1999 | Bishop |
| 6,011,345 | A | | 1/2000 | Murray et al. |

* cited by examiner

Primary Examiner—Carl J. Arbes
Assistant Examiner—Tai Nguyen
(74) Attorney, Agent, or Firm—Michael G. Crilly, Esq.

(57) ABSTRACT

The invention described and claimed is method of fabricating a planar pre-stressed bimorph actuator. The bimorph actuator is a symmetric load system composed of electrically and mechanically similar transductive elements. The method facilitates the bonding of planar metallic members about likewise planar transductive members thereby forming a planar multi-layer element. Fabricaton is performed at an elevated temperature under a vacuum with a mechanical load applied to the multi-layer element.

1 Claim, 4 Drawing Sheets

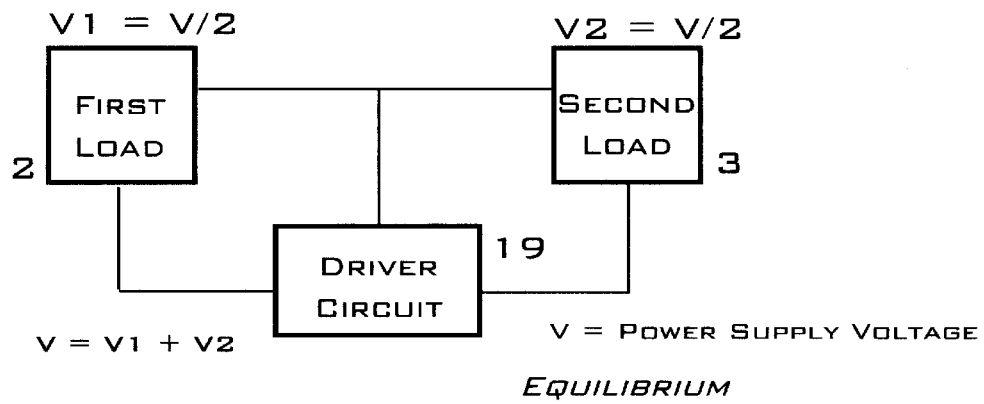
FIG. 1A
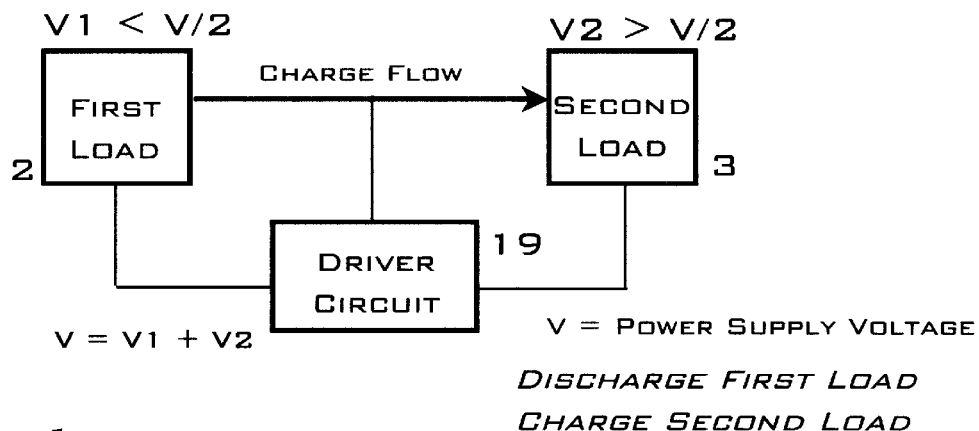
FIG. 1B
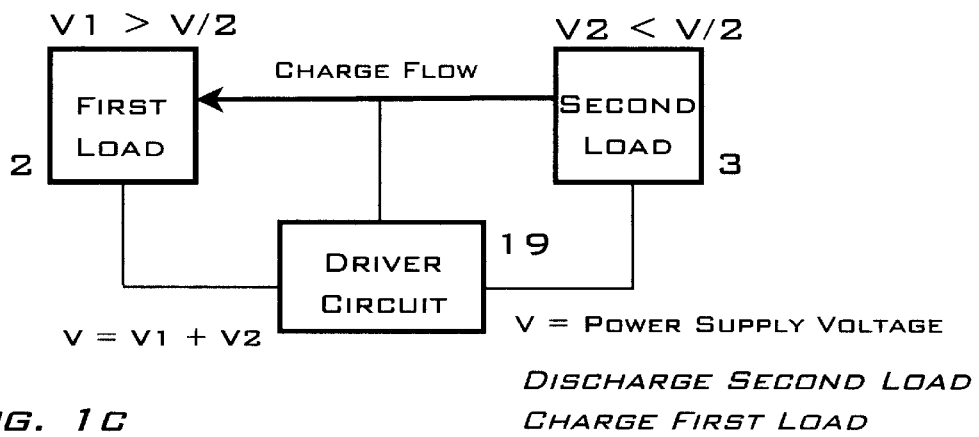
FIG. 1C
FIGURE 1

METHOD OF FABRICATING A PLANAR PRE-STRESSED BIMORPH ACTUATOR

CROSS-REFERENCE TO RELATED APPLICATIONS

This application is a divisional application of application Ser. No. 09/819,508, filed Feb. 28, 2001 U.S. Pat. No. 6,465,931 and claims the benefit of U.S. Provisional Application No. 60/192,887 filed on Mar. 29, 2000. The subject matters of the prior applications are incorporated in their entirety herein by reference thereto.

FEDERALLY SPONSORED RESEARCH OR DEVELOPMENT

None.

BACKGROUND OF THE INVENTION

1. Field of the Invention

The present invention generally relates to a driver circuit with bimorph actuator. The invention specifically described is a power circuit based on a balanced capacitive loading method wherein the load itself acts as an energy storage element in the energy balance system. The invention is applicable to flight and motion control elements.

2. Related Arts

A large class of active control devices incorporate small, high-force transductive mechanisms to develop mechanical force. A bimorph actuator is a specific type of transductive mechanism composed of two transductive elements bonded to a flexible metallic element functioning as a central electrode. A bimorph functions as an actuator when transductive elements are wired so that elongation occurs along one element and contraction occurs along another. Transductive mechanisms are inherently lossless, therefore energy pumped into the device is returned except for a small portion expended producing mechanical work.

Various power circuits are known within the art to drive transductive mechanisms, while linear driver circuits are the most common. Such drivers are very inefficient in that return energy from the transductive mechanism is dissipated thermally and thereby no longer available to drive the mechanism. Some improved performance is obtained with class D implementations of the electronics, however, the issue of how to store the transient return energy remains unresolved.

A more attractive solution to reverse energy flow is a regenerative driver circuit as disclosed in U.S. Pat. No. 6,001,345 issued to Murray et al. on Jan. 4, 2000. However, Murray et al. suffers two fundamental problems. First, the invention requires a negative impedance inverter that is both quite complex to achieve and never adequately demonstrated in practice. Secondly, the invention requires a large output bypass capacitor. The capacitor value is chosen according to $$R_{Load}C_{Filter} >> 1/F$$

where F is the ripple frequency. The ripple current is impressed by the transients in and out during switching. This leads to a minimal requirement of the output bypass capacitor, where $$C_{filter} >> C_{load}$$

is required to achieve a $\omega_{3db}$ bypass. Consequently, the power bypass capacitor quickly becomes the dominating factor in terms of mass, volume, and performance at larger loads. The result is diminished advantages in terms of efficient power handling and compact implementation of the switching section in the drive topology.

Conventional power circuits are designed to drive only one side of a transductive system. When applied to a bimorph system, the lossless nature of the transducers requires nearly all of the input energy returned and either transferred out the system as thermal energy or recovered and redirected. If recovered, the energy is typically recycled with additional input side energy to drive the other symmetric load at the output side of the circuitry. The recovery-recycle methodology as applied to symmetrically coupled systems by conventional circuits produces large peaks in the power supply ripple current. Consequently, such systems are inherently unstable.

What is required is a bimorph actuator with driver circuit capable of rapidly redirecting energy between loads in the actuator. The driver circuit with bimorph should substantially reduce peak power loading without increasing total power demand, eliminate the large bypass capacitor required in the related arts, and eliminate power supply instabilities inherent to regenerative and conventional electronics.

SUMMARY OF THE INVENTION

An object of the present invention is to provide a small, lightweight bimorph actuator system with volumetrically efficient and stable driver circuit.

To these ends, the present invention provides a regenerative class D power circuit attached to a symmetrically terminated bimorph actuator. The driver circuit incorporates a new balanced capacitive loading method using the pure reactive portion of the load itself as an energy storage element in the energy balance system. A half-bridge FET topology controls charge-discharge between two halves of a bimorph actuator causing energy to be cycled from one side of the bimorph to the other. Half-bridge averaging is externally commanded via a control module whereby an imbalance is caused producing current to flow in one desired direction only. The driver circuit causes the charge to equilibrate within the bimorph in reference to the new average control module charge. The load on the driver at any given instant is the total output load, while load on the d.c. power supply is only the real power to the load used plus any switching losses. A control module, one example being a PWM, is employed as to institute power flow between symmetric loads as seen on the output side of the circuit. Bimorph actuator is comprised of a plurality of planar members. A middle planar layer is sandwiched between two mechanically and electrically similar transductive elements thereby isolating one from the other. An outer layer is thereafter bonded to each transductive layer.

The present invention is lighter and smaller with increased efficiency over the related arts. The present invention significantly reduces the high-voltage power supply bypass capacitor representing the largest component in class D and regenerative class D circuitry. The present invention enables larger effective output filter values in a smaller package thereby increasing robustness. The present invention enables the compact, lightweight implementation for driving a high-voltage bimorph actuator. The present invention effectively enables higher switching voltage into the bimorph actuator thereby retaining the high efficiency of regenerative circuits.

BRIEF DESCRIPTION OF THE DRAWINGS

The invention will now be described in more detail, by way of example only, with reference to the accompanying drawings, in which:

FIG. 1 describes charge transfer between transductive elements in series.

REFERENCE NUMERALS

Figure 2:
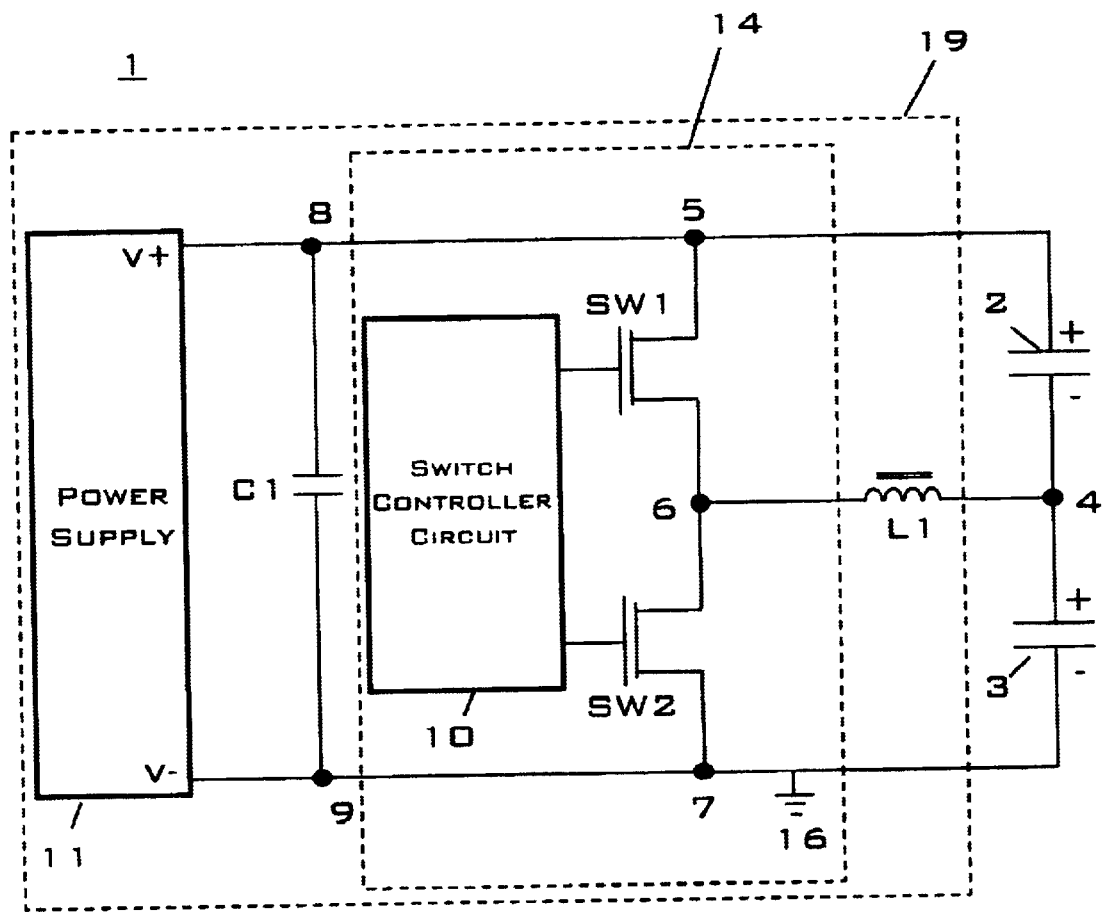
FIG. 2 shows a circuit diagram for a half-bridge embodiment of the present invention.

SW1 First switch
SW2 Second switch
L1 Filter inductor
C1 Bypass capacitor
1 Switchmode power control circuit
2 First load
3 Second load
4 Center tap
5 Node B
6 Node C
7 Node D
8 Node E
9 Node F
10 Switch controller circuit
11 Power supply
12 Node H
13 Node I
14 Regenerative drive
16 Ground
17 First single load
18 Second single load
19 Driver circuit
20 Median axis
22 First outer layer
23 Second outer layer
24 First transductive element
25 Second transductive element
26 Middle layer
27 Adhesive
28 Bimorph actuator
30 Planar configuration
31 Upper layer
32 Lower layer

DESCRIPTION OF THE INVENTION

FIG. 1 generally describes the present invention at a functional level. The invention consists of a first load 2, a second load 3, and a driver circuit 19. Both first load 2 and second load 3, having identical mechanical and electrical impedance, are transductive elements 24, 25 in the bimorph actuator 28. The driver circuit 19 provides d.c. voltage to both first load 2 and second load 3 arranged in series such that at equilibrium one-half of the total voltage (V) from the power supply 11 within the driver circuit 19 resides within the first load 2 (V/2) and the second load 3 (V/2). This condition is referred to as the equilibrated charge state and is represented in FIG. 1a.

The driver circuit 19 cycles and recycles power between the first load 2 and the second load 3 via the charge transfer process. In FIG. 1b, the driver circuit 19 directs power from the first load 2 to the second load 3. While the total voltage (V) across first load 2 and second 3 equals the power supply 11 voltage, more voltage resides within the second load 3. In FIG. 1c, the driver circuit 19 redirects power from the second load 3 to the first load 2. Again while the total voltage (V) across first load 2 and second load 3 is equal to the power supply 11 voltage, more voltage now resides within the first load 2. In both charge flow descriptions, the driver circuit 19 alters current flow within a half-bridge topology via opening (OFF condition) and closing (ON condition) of two switches. During charge transfer, the load from which charge is directed is functionally an energy storage element facilitating the transfer process.

The switchmode power control circuit 1 includes a first load 2 and a second load 3 connected to a driver circuit 19. The driver circuit 19 consists of a filter inductor L1, a regenerative drive 14, a bypass capacitor C1, and a power supply 11.

FIG. 2 describes the half-bridge embodiment of the switchmode power control circuit 1. First load 2 and second load 3 are connected in series at the center tap 4, node B 5, and node D 7. The negative terminal from the first load 2 is connected to the positive terminal from the second load 3 at the center tap 4. The positive terminal from the first load 2 is connected to node B 5 thereby aligning the positive terminal with the positive output on the power supply 11. The negative terminal from the second load 3 is connected to node D 7 thereby aligning the negative terminal with the negative output on the power supply 11. A filter inductor L1 is connected to the center tap 4 between first load 2 and second load 3 and node C 6 between first switch SW1 and second switch SW2. Nodes B 5, C 6, and D 7 facilitate connection of first load 2, second load 3, and filter inductor L1 to the regenerative drive 14. The regenerative drive 14 consists of a first switch SW1, a second switch SW2, and a switch controller 10. First switch SW1 and second switch SW2 are connected in series to node B 5, node D 7, and dually to node C 6 thereby parallel to both first load 2 and second load 3. A switch controller circuit 10 is connected to both first switch SW1 and second switch SW2. Parallel to both first switch SW1 and second switch SW2 and opposite of both first load 2 and second load 3 is a bypass capacitor C1 connected at node E 8 and node F 9. A power supply 11 is connected adjacent to the bypass capacitor C1. The power supply 11 is of finite impedance and applies d.c. voltage to the driver circuit 19. The power supply 11 replenishes voltage lost during switching and that portion expended by first load 2 and second load 3.

The regenerative circuit 14 consists of a first switch SW1, second switch SW2, and switch controller circuit 10. Both first switch SW1 and second switch SW2 rapidly and alternately switch between OFF and ON, thereby adjusting current flow within the switchmode power control circuit 1 and energy flow between the first load 2 and the second load 3. Example switches SW1, SW2 include bipolar transistors, MOSFET's and IBGT's, all known within the art. The filter inductor L1 stores energy when either first switch SW1 or second switch SW2 is ON thereby providing a temporary charge flow bias at the onset of the next switching condition. The switch controller circuit 10 consists of a high-frequency PWM modulator and driver circuitry known within the art. The switch controller circuit 10 controls timing and duration of OFF and ON conditions at first switch SW1 and second switch SW2. In preferred embodiments, OFF and ON switching at both first switch SW1 and second switch SW2 occurs at frequencies in the hundreds of kilohertz. The PWM is modulated with the desired waveform, examples including but not limited to sine, square, and sawtooth waves. The bypass capacitor C1 compensates for alternating current conditions at the power supply 11 thereby eliminating current ripple. The switchmode power control circuit 1 is terminated to a ground 16.

First load 2 and second load 3 may consist of one or more capacitive elements. In the most preferred embodiment, both first load 2 and second load 3 are mechanically and electrically matched transductive elements. While various embodiments are possible, the total mechanical and electrical impedance of the first load 2 closely approximate that of the second load 3.

Figure 3:
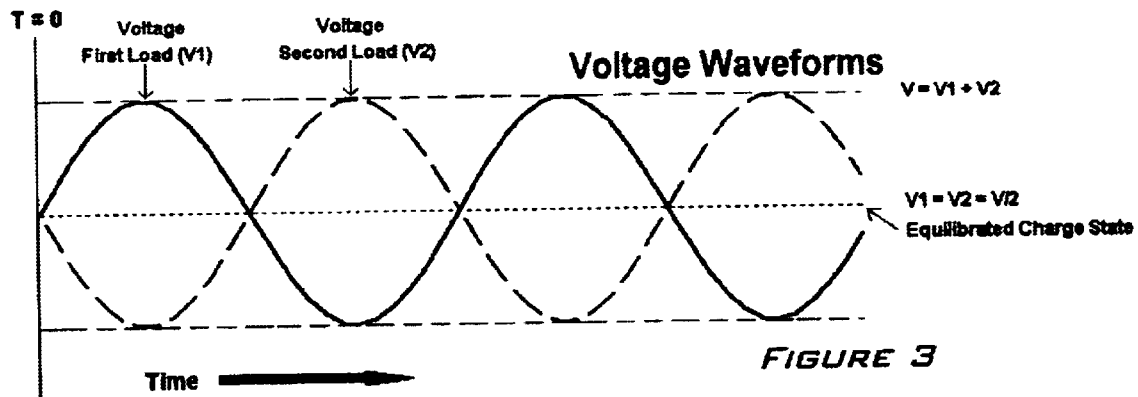
FIG. 3 graphically describes the voltage waveforms generated when driving a bimorph actuator.
Figure 4:
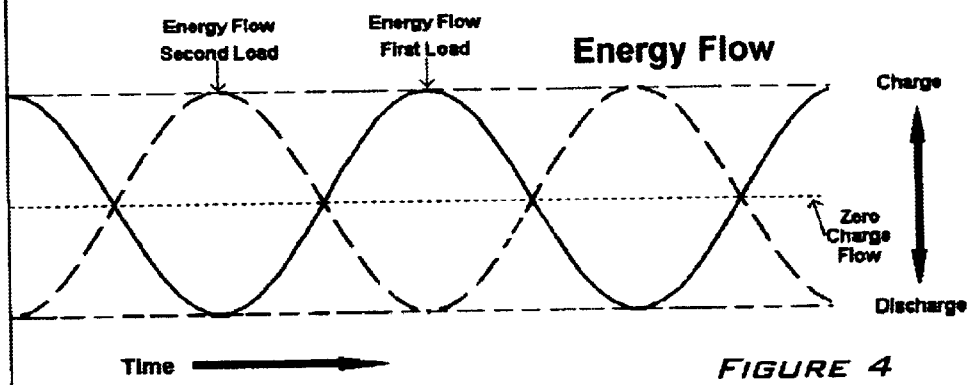
FIG. 4 graphically describes the energy flow waveforms generated when driving a bimorph actuator.
Figure 5:
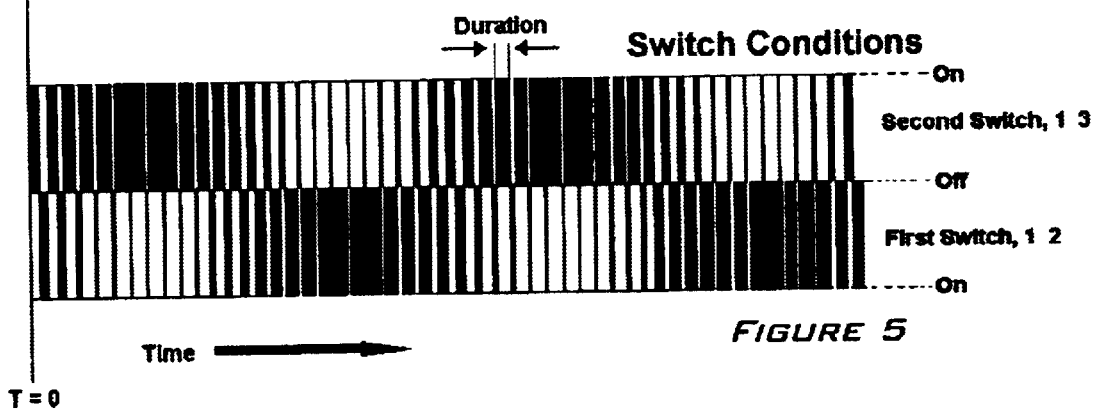
FIG. 5 graphically describes the switch states when driving a bimorph actuator.

FIG. 3 describes typical voltage waveforms at both first load 2 and second load 3. FIG. 4 describes typical energy flow waveforms for first load 2 and second load 3. Both Figures assume a sinusoidal command function from the switch controller circuit 10 into the first switch SW1 and the second switch SW2. However, any fixed or variable function is applicable to the present invention. FIG. 5 artistically describes OFF and ON conditions at first switch SW1 and second switch SW2 for waveforms profiles in FIGS. 3 and 4 to aid functional visualization.

The equilibrated charge state is identified in FIG. 3 as a horizontal line with a magnitude V/2 representing one-half the total voltage (V) across the power supply 11. This condition is maintained by the rapid OFF and ON switching of first switch SW1 and second switch SW2 at a constant frequency of equal duty cycle duration. Neither charge nor discharge occur at the equilibrated charge state. Voltage at center tap 4 is one-half of the power supply 11 voltage (V) and at node C 6 is either the power supply 11 voltage (V) or zero.

Charge transfer from the second load 3 to the first load 2 is achieved by increasing the duration of the ON condition at the second switch SW2 thereby causing a corresponding increase in the OFF condition at the first switch SW1. Switching bias increases the discharge of energy at the second load 3 facilitating redirection to the first load 2. Alternatively, charge transfer from the first load 2 to the second load 3 is achieved by increasing the duration of the ON condition at the first switch SW1 thereby causing a corresponding increase in the OFF condition at the second switch SW2. Here, biased switching effectively increases the discharge of energy at the first load 2 and redirects it into the second load 3. The resultant voltage waveforms for both first load 2 and second load 3 are sinusoidal however phase shifted 180 degrees. The total sum voltage at any time is equal to the power supply 11 voltage (V). The energy flow waveforms for first load 2 and second load 3 are also sinusoidal and phase shifted 180 degrees. Additionally, current and energy flow waveforms for each of the first load 2 and second load 3 are phase shifted 90 degrees.

The charge transfer process at the circuit level is the following. When the first switch SW1 is ON and the second switch SW2 is OFF, current in the filter inductor L1, accumulated when the second switch SW2 was ON charging node C 6 to V and center tap 4 to V/2, continues to flow in the positive direction for a short duration into the first switch SW1. Thereafter, the charge direction reverses into the filter inductor L1 since voltage at node C 6 is now zero and the voltage at center tap 4 is V/2. This charge flow pattern effectively "pulls" current from center tap 4 through first load 2 and second load 3 and "pushes" current into the ground 16. When the first switch SW1 is OFF and the second switch SW2 is ON, current in the filter inductor L1, accumulated when the first switch SW1 was ON causing node C 6 to have no voltage and placing center tap 4 at V/2, continues to flow in the negative direction for a short duration into the second switch SW2. Thereafter, the charge direction reverses away from the filter inductor L1 since voltage at node C 6 is now the power supply 11 voltage (V) and the voltage at center tap 4 is one-half the power supply 11 value. This charge flow pattern effectively "pulls" current from node C 6 and "pushes" current through the first load 2 and second load 3. But because the loads are not referenced to the same point, the current causes a differential variation in the loads thereby effectively producing the "pushing" and "pulling" described above.

Figure 6:
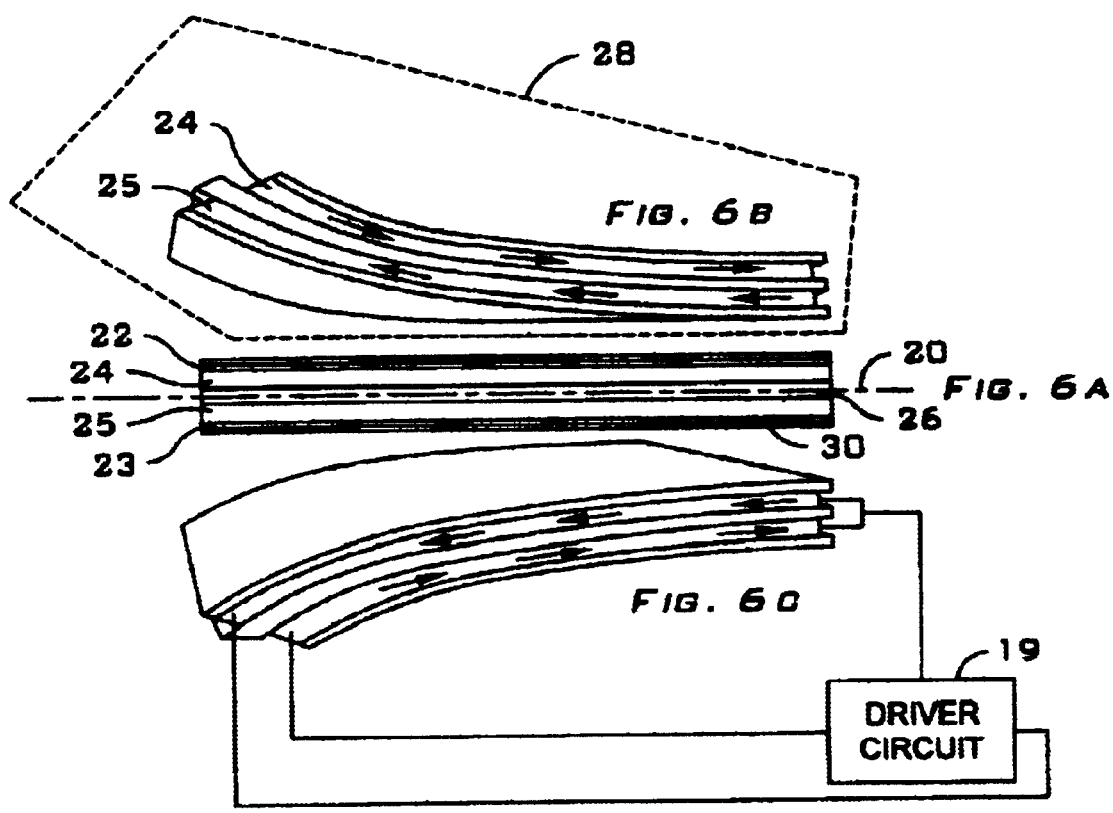
FIG. 6 describes a bimorph actuator.

FIG. 6 describes a typical bimorph actuator 28. The switchmode power control circuit 1 is a mechanical half-bridge. A bimorph actuator 28 consists of a plurality of planar members about a median axis 20. The preferred embodiment consists of a middle layer 26 sandwiched between a first transductive element 24 and a second transductive element 25. The middle layer 26 is a material sufficient to isolate the first transductive element 24 from the second transductive element 25. Transductive elements 24, 25 may consist of one or more capacitive elements, however the total capacitance of both transductive elements 24, 25 are approximately equal. In the preferred embodiment, a first outer layer 22 and a second outer layer 23 further sandwich the transductive elements 24, 25. The outer layers 22, 23 are any stiff yet flexible homogeneous or composite material with the preferred embodiment being a metal. In the most preferred embodiment, transductive elements 24, 25 are bonded to the middle layer 26 and outer layers 22, 23.

The bimorph actuator 28 forms a planar configuration 30 either when no charge is applied to the transductive elements 24, 25 or when equal charges are applied within the switchmode power control circuit 1 to the transductive elements 24, 25, as shown in FIG. 6a. The planar configuration 30 is altered via the driver circuit 19 by the charge transfer method. Charge transfer is achieved when the charge balance is altered between transductive elements 24, 25 resulting in biased displacement of the bimorph actuator 28, sometimes referred to as the unimorph effect. FIG. 6b shows upward curvature in the bimorph actuator 28 about the median axis 20 when charge is removed from the first transductive element 24 and applied to the second transductive element 25. FIG. 6c shows downward displacement in the bimorph actuator 28 about the median axis 20 when charge is removed from the second transductive element 25 and applied to the first transductive element 24. Charge flow directions are noted in FIGS. 6b and 6c. The amount of displacement is limited by the charge saturation characteristics of the transductive elements 24, 25 and the stiffness of the bimorph actuator 28.

Figure 7:
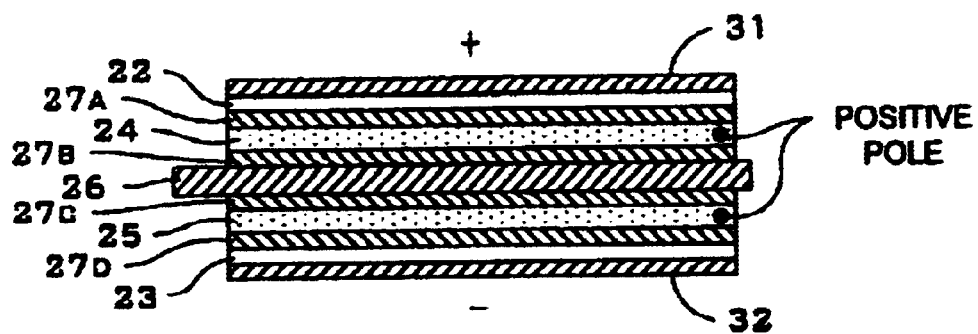
FIG. 7 shows a preferred embodiment of the bimorph embodiment.

FIG. 7 shows a preferred embodiment of the bimorph actuator 28. The pre-stressed bimorph actuator 28 consists of a steel or titanium middle layer 26, a piezoceramic first transductive element 24, a piezoceramic second transductive element 25, an aluminum first outer layer 22, and an aluminum second outer layer 23 wherein layers 22, 23, 26 and elements 24, 25 are bonded by an adhesive 27. In an alternate embodiment, an upper layer 31 and a lower layer 32 are applied to the bimorph actuator 28 consisting of a low-friction material preferably polytetrafluoroethylene. The most preferred embodiment consisting of the following: outer layers 22, 23 being a 1.96 inch wide by a 1.96 inch long by a 0.001 inch thick aluminum, ASTM B20, plate; transductive elements 24, 25 being a 2.04 inch wide by 2.04 inch long by 0.015 inch thick 3195HD ceramic manufactured by the CTS Corporation of Albuquerque, N.M.; middle layer 26 being a 3.0 inch wide by 2.24 inch long by 0.02 inch thick stainless steel plate, type 302, ASTM A117; and adhesive 27 being a high temperature polyimide commonly known as LaRC-SI.

The preferred embodiment is assembled with the following process. The outer layers 22, 23 are perforated and cleaned. The piezoceramics are cleaned and sprayed with LaRC-SI solution (e.g., 8% LaRC-SI powder and 92% N-methyl-pyrolidinone) and then dried in an oven. The middle layer 26 is scuffed, primed, piezoceramics applied to the middle layer 26, and outer layers 22, 23 applied to the piezoceramics. A pre-heat step may be used to soften the adhesive 27 and provide the adherence required to keep elements 24, 25 and layers 22, 23, 26 together during assembly. An alcohol solution also serves the same purpose. To insure a uniform bond, a vacuum bagging process is used to plate and fixture as to apply equal pressure onto individual elements while in the autoclave. The bimorph actuator 28 is placed into the autoclave, platen pressed, and subject to a pressure and temperature. During the autoclave cycle, the bimorph actuator 28 is heated, squeezed, cooked, then cooled to room temperature. During cool down, differences in the thermal coefficients of expansion between metals and ceramic creates a stress state within the material resulting in a flat planar configuration 30.

The bimorph actuator 28 is polarized on either the outside of each ceramic or on the top of each ceramic. Three wires are attached to the structure. One wire is attached to the first outer layer 22 thereby providing a positive. A second wire is attached to the second outer layer 23 thereby providing a negative. And a third wire is attached to the middle layer 26 for grounding.

A multilaminar version of the bimorph actuator 28 is realized by the sequential layering of two or more bimorph actuators 28 separated by a frictionless material as described by the upper layer 31 and the lower layer 32. Two electroding options are possible. The first option consists of similarly poling and driving the piezoceramics in parallel on one side of the median axis 20, thereby functioning as the first load 2, and similarly poling and driving the piezocermics in parallel on the opposite side of the median axis 20, thereby functioning as the second load 3. The second option alternates poling and electroding thereby treating odd numbered piezoceramics as the first load 2 and even numbered piezoceramics as the second load 3.

The description above indicates that a great degree of flexibility is offered in terms of the present invention. Although the present invention has been described in considerable detail with reference to certain preferred versions thereof, other versions are possible. Therefore, the spirit and scope of the appended claims should not be limited to the description of the preferred versions contained herein.

What is claimed is:

1. A method of fabricating a planar pre-stressed bimorph actuator comprising the steps of:

(a) selecting a first outer layer, a second outer layer, a middle layer, a first transductive element, a second transductive element, and an adhesive so as to maximize differences in thermal expansion characteristics, said first outer layer, said second outer layer, and said middle layer composed of a metal, said first transductive element and said second transductive element composed of a piezoceramic, said adhesive composed of a high temperature polyimide;

(b) perforating said first outer layer and said second outer layer;

(c) cleaning said first outer layer, said second outer layer, said first transductive element, and said second transductive element prior to assembly;

(d) spraying said adhesive onto said first transductive element and said second transductive element along each planar surface contacting said first outer layer, said second outer layer or said middle layer;

(e) drying said adhesive in an oven to harden said adhesive;

(f) softening said adhesive via a solvent prior to assembly;

(g) assembling said first transductive element and said second transductive element onto said middle layer, said first outer layer onto said first transductive element, and said second outer layer onto said second transductive element thereby forming an assembly;

(h) vacuum bagging said assembly;

(i) applying pressure to said assembly;

(j) heating said assembly; and (k) cooling said assembly to room temperature so as to produce said planar pre-stressed bimorph actuator when pressure is removed, said planar pre-stressed bimorph actuator capable of curved deflection about a median axis of said assembly at one end of said assembly when electrically activated, said first transductive element bonded in a planar fashion to said first outer layer and a first planar surface along said middle layer, said second transductive element bonded in a planar fashion to said second outer layer and a second planar surface along said middle layer.

* * * * *

UNITED STATES PATENT AND TRADEMARK OFFICE
CERTIFICATE OF CORRECTION

PATENT NO. : 6,665,917 B2  Page 1 of 1
DATED : December 23, 2003
INVENTOR(S) : Knowles et al.

It is certified that error appears in the above-identified patent and that said Letters Patent is hereby corrected as shown below:

<u>Column 1,</u>
Line 16, delete "None."
Line 16, insert -- This invention was made with Government support under Contract NAS1-00044 awarded by NASA. The Government has certain rights in this invention. --

Signed and Sealed this

Twenty-second Day of March, 2005

JON W. DUDAS
*Director of the United States Patent and Trademark Office*